United States Patent
Yoshida et al.

(10) Patent No.: US 6,972,097 B2
(45) Date of Patent: Dec. 6, 2005

(54) COMPOSITE MAGNETIC MATERIAL AND ELECTROMAGNETIC INTERFERENCE SUPPRESSOR MEMBER USING THE SAME

(75) Inventors: Shigeyoshi Yoshida, Miyagi (JP); Mitsuharu Sato, Miyagi (JP); Eishu Sugawara, Miyagi (JP); Yutaka Shimada, Miyagi (JP); Norihiko Ono, Miyagi (JP); Osamu Ito, Akita (JP)

(73) Assignee: NEC TOKIN Corporation, Miyagi (JP)

( * ) Notice: Subject to any disclaimer, the term of this patent is extended or adjusted under 35 U.S.C. 154(b) by 62 days.

(21) Appl. No.: 10/660,875

(22) Filed: Sep. 12, 2003

(65) Prior Publication Data

US 2004/0108486 A1 Jun. 10, 2004

Related U.S. Application Data

(63) Continuation-in-part of application No. 09/459,431, filed on Dec. 13, 1999, now abandoned, which is a continuation-in-part of application No. 09/374,860, filed on Aug. 16, 1999, now abandoned, which is a continuation of application No. 09/066,382, filed as application No. PCT/JP97/03067 on Sep. 2, 1997, and a continuation of application No. 08/809,220, filed as application No. PCT/JP96/02040 on Jul. 22, 1996, now abandoned.

(30) Foreign Application Priority Data

Jul. 20, 1995 (JP) .............................. 7-183911
Sep. 2, 1996 (JP) .............................. 8-231957

(51) Int. Cl.$^7$ ................................. H01F 1/26
(52) U.S. Cl. ................... 252/62.54; 252/62.55
(58) Field of Search ......................... 252/62.55, 62.54

(56) References Cited

U.S. PATENT DOCUMENTS

| 4,003,840 A | 1/1977 | Ishino |
| 4,814,546 A | 3/1989 | Whitney |
| 5,827,445 A | * 10/1998 | Yoshida et al. .......... 252/62.54 |

FOREIGN PATENT DOCUMENTS

| JP | 58-219249 | 12/1983 |
| JP | 02-205601 | 8/1990 |
| JP | 07-212079 | 8/1995 |

* cited by examiner

*Primary Examiner*—C. Melissa Koslow
(74) *Attorney, Agent, or Firm*—Bradley N. Ruben

(57) ABSTRACT

A composite magnetic material is provided for use as an electromagnetic interference suppressing body for effectively suppressing an electromagnetic interference within a high frequency apparatus including a mobile communication terminal. The composite magnetic material consists essentially of a soft magnetic powder and an organic binder and is electrically non-conductive and has at least two magnetic resonances caused by at least two anisotropic magnetic fields (Hk). In the composite magnetic material, the anisotropic magnetic fields (Hk) are different in strength from each other.

4 Claims, 10 Drawing Sheets

COMPOSITE MAGNETIC MATERIAL AND ELECTROMAGNETIC INTERFERENCE SUPPRESSOR MEMBER USING THE SAME

This application is a continuation-in-part of Ser. No. 09/459,431, filed Dec. 3, 1999, now abandoned, which is a continuation-in-part of both Ser. No. 09/374,860 filed Aug. 16, 1999 now abandoned, which is a continuation-in-part of Ser. No. 09/066,382, filed Apr. 29, 1998, which is the U.S. national phase of PCT/JP97/03067, filed Sep. 2, 1997 and a continuation of Ser. No. 08/809,220, filed May 12, 1997 now abandoned, which is the U.S. national phase of PCT/JP96/02040, filed Jul. 22, 1996.

BACKGROUND OF THE INVENTION (1) Field of the Invention

The present invention relates to composite magnetic materials comprising soft magnetic powders kneaded with and dispersed in an organic binder and, in particular, to the composite magnetic material excellent in a characteristic of complex magnetic permeability effective in suppressing an electromagnetic interference which is a problem in high frequency electronic circuits/devices, and to a method for producing the same.

The present invention further relates to electromagnetic interference suppressing body and electronic parts, such as printed circuit boards used in electronic apparatus, which use the above-mentioned composite magnetic materials.

The present invention still further relates to composite magnetic material which is excellent in flexibility, stickable to, for example, an FPC (Flexible Printed circuit, an FFC (Flexible Flat Cable), and a casing of an electronic equipment, and further excellent in fire resistance or noncombustibility, to a method of producing the same, and an electromagnetic interference suppressing body constituted of that composite magnetic material.

(2) Related Art

As digital electronic apparatus which have recently been widely used, there are known logic circuits or elements, such as a random access memory (RAM), a read only memory (ROM), a microprocessor unit (MPU), an image processing algebra logic unit (IPALU) or the like. The logic circuit and the logic element comprise LSI and IC including a large number of semiconductor elements of active elements and are mounted on a printed circuit board. In the logic circuit and element, executing speed and signal processing speed are increased. In such a logic circuit or the like, high-speed signals are accompanied by sudden variation of voltage and current, so that the active elements generate inductive noise which is high frequency noise. The high frequency noise cooperates with the other noise, such as crosstalk noise and impedance mismatching noise. The high frequency noise is mainly caused by the inductive noise generated by the active element. The inductive noise induces a high frequency magnetic field on a surface of the printed circuit board on which the element is mounted and on the opposite surface.

In addition, electronic devices and apparatus are rapidly improved to decrease in weight, thickness, and size. Accompanying this, a density is extremely increased in mounting of electronic devices onto the printed circuit board. Since printed wires between the electronic devices mounted with high mounting density or wires between modules are placed near to each other, and since the signal processing speed is increased as described above, the induced high frequency magnetic field increases the electromagnetic coupling between wires on the printed circuit board due to radiation noise.

The radiation noise as generated is radiated through an external connection terminal outside the device to cause a harmful influence upon the other devices. The harmful influence to the other devices and the malfunction of the electronic apparatus are collectively called as an electromagnetic obstacle.

Against the electromagnetic obstacles radiated, some countermeasures are adopted in the prior art. As typical examples of the countermeasures, connecting a filter to a circuit which generates the inductive noise in the electronic device, separating a circuit having a problem (which generates the inductive noise) from another circuit influenced thereby, and shielding, or grounding have been carried out.

In a printed circuit board or others on which electronic parts including active elements are mounted in a high density, those known countermeasure against the electromagnetic obstacle (noise suppression) has disadvantages, for example, that special knowledge and experience are required therefor and a long time is required for establishment of the countermeasure.

Particularly, the use of the filter as mentioned above has disadvantages that the filter used for removing noises is too expensive, that a space mounting the filter is often limited, that a work of mounting a filter is accompanied with a difficulty, and that many steps are required for assembling a device including the filter or the like to result in high cost.

In addition, suppression against an electromagnetic induction and interference by undesired electromagnetic wave which are generated between devices placed in the same circuit is not sufficient in the prior art.

Furthermore, for miniaturization of and lightening the electronic device, the method of removing a problem from circuit is disadvantageous and it is required to remove a filter and a mounting space thereof.

When a general printed circuit board, which is used for an electronic device, is used in a low frequency band, no problem occurs because the electromagnetic couplings between signal lines, such as electromagnetic induction generated in the printed circuit board, is relatively small. However, as an operating frequency grows higher, the electromagnetic couplings between the signal lines become bigger.

Among shielding methods, as the conductive shield is one of measures against the electromagnetic interference which uses a reflection of electromagnetic wave caused by impedance mismatching with space, it can provide the shield effect, but promote an electromagnetic coupling due to the reflection of an undesired radiation so that there often causes a secondary electromagnetic interference.

For a measure against the secondary electromagnetic interferences, it is effective to use the magnetic loss of a magnetic substance to suppress the undesired radiation. That is, the undesired radiation can be suppressed by displacement of the magnetic substance having a high magnetic loss between the shield substance and the undesired radiation source. Herein, the magnetic substance has a thickness d inversely proportional to $\mu''$ in a frequency region fulfilling a relation of $\mu''>\mu'$. A magnetic material is required which has a large complex magnetic permeability in order to obtain a thin electromagnetic interference suppressing body or a composite member comprising a shielding element and a magnetic element so as to accommodate a demand of miniaturization of and lightening the electronic device. It is desired for the electromagnetic interference suppressing body to deal with the undesired radiation over wide frequency.

SUMMARY OF THE INVENTION

It is an object of the present invention to provide a composite magnetic material for use in an electromagnetic interference suppressing body effective to inhibit an electromagnetic interference within a high frequency electronic device, typically, a mobile communication device.

It is another object of the present invention to provide a composite magnetic material capable of meeting a requirement of severe vibration resistance, shock resistance, and adaptability for a complex shape.

It is still another object of the present invention to provide a composite magnetic material which is excellent in flexibility, stickable to, for example, a FPC, an FFC, or a curved surface of a casing of an electronic equipment and further excellent in fire resistance.

It is yet another object of the present invention to provide a method of producing the composite magnetic material.

It is a further object of the present invention to provide an electromagnetic interference suppressing body using the above-composite magnetic material.

It is a still further object of the present invention to provide an electronic device which has a compact size and a light weight and can inhibit effectively an electromagnetic interference by provision of the electromagnetic interference suppressing body.

It is a yet further object of the present invention to provide a printed circuit board which has a sufficient shield effect against the transmission of electromagnetic wave without deteriorating a shield effect of the printed circuit board with an electromagnetic shield, and does not promote at least a magnetic coupling due to a reflection of an electromagnetic wave.

According to one aspect of the present invention, there is provided a composite magnetic material which comprises a metallic soft-magnetic powder and organic binder. The composite magnetic material has non-conductivity and a plurality of anisotropic magnetic field, and also magnetic loss term having a plurality of magnetic resonances taken place in frequency regions different from each other.

According to another aspect of the present invention, there is provided a composite magnetic material as above-described. In the composite magnetic material, the plurality of magnetic resonances in frequency regions different from each other are caused from mixing a plurality of powders having an asnisotropic magnetic fields (Hk) different in strengths from each other.

According to still another aspect of the present invention, there is provided a composite magnetic material as above-described. In the composite magnetic material, the plurality of anisotropic fields is different from each other and is given by a monotonous magnetic powder. The monotonous magnetic powder has a single kind of composition, a monotonous particle size distribution, and a specific surface area of $0.3 \, m^2/g$ or more. The monotonous particle size distribution has a distribution curve with a maximum value but without maximal and minimal values.

According to yet another aspect of the present invention, there is provided an electromagnetic interference suppressing body comprising a composite magnetic material described above.

According to a further aspect of the present invention, there is provided an electromagnetic interference suppressing body as above-described. In the electomagnetic interference suppressing body, the lowest one of said magnetic resonances occurring in a frequency region lower than a lower limit of the electromagnetic interference suppression frequency band caused by the magnetic interference suppressing body.

DESCRIPTION OF THE PREFERRED EMBODIMENTS

For a better understanding of this invention, description will first be made as regards a conventional printed circuit board with reference to FIG. 1.

Figure 1:
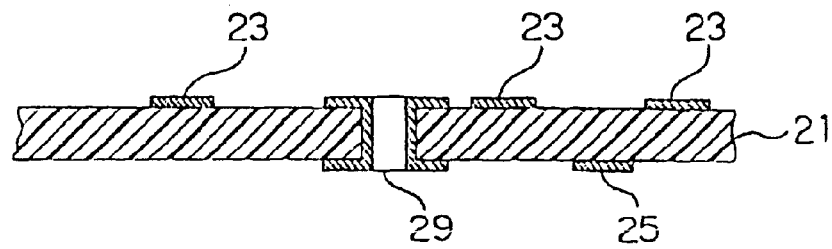
FIG. 1 is a cross sectional view of a part of a conventional printed circuit board.

Referring to FIG. 1, a printed circuit board 21 has circuit conductors 23 and 25 formed on both surfaces. The circuit conductors are made by printing, etching, or the like. A through hole 29 is made to connect between an upper surface and a lower surface.

Next, description will be made as regards conventional electronic apparatus with reference to FIGS. 2 to 4.

Figure 2:
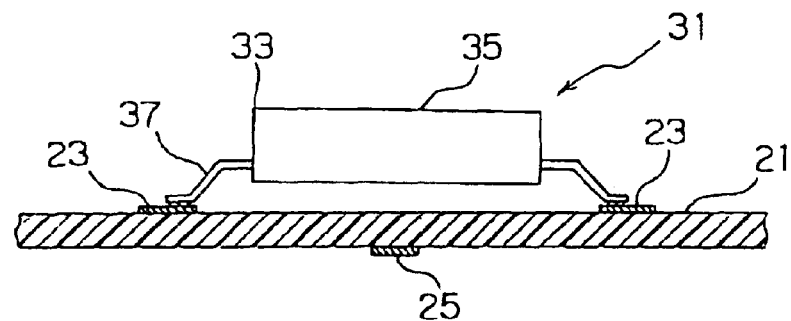
FIG. 2 is a cross sectional view of a part of an example of a conventional electronic apparatus.

Referring to FIG. 2, an electronic apparatus 31 comprises an LSI 33 mounted on a surface of the printed circuit board 21. The LSI 33 has a LSI body 35 and contact pin terminals 37. The contact pin terminals 37 extend to conductive patterns 23, respectively, formed on the surface of the printed circuit board 21. The LSI body 35 is disposed in a floating state with a distance left between the LSI body 35 and the surface of the printed circuit board 21. A circuit conductor (pattern) 25 is wired to extend just below the LSI 33 on the printed circuit board 21.

Figure 3:
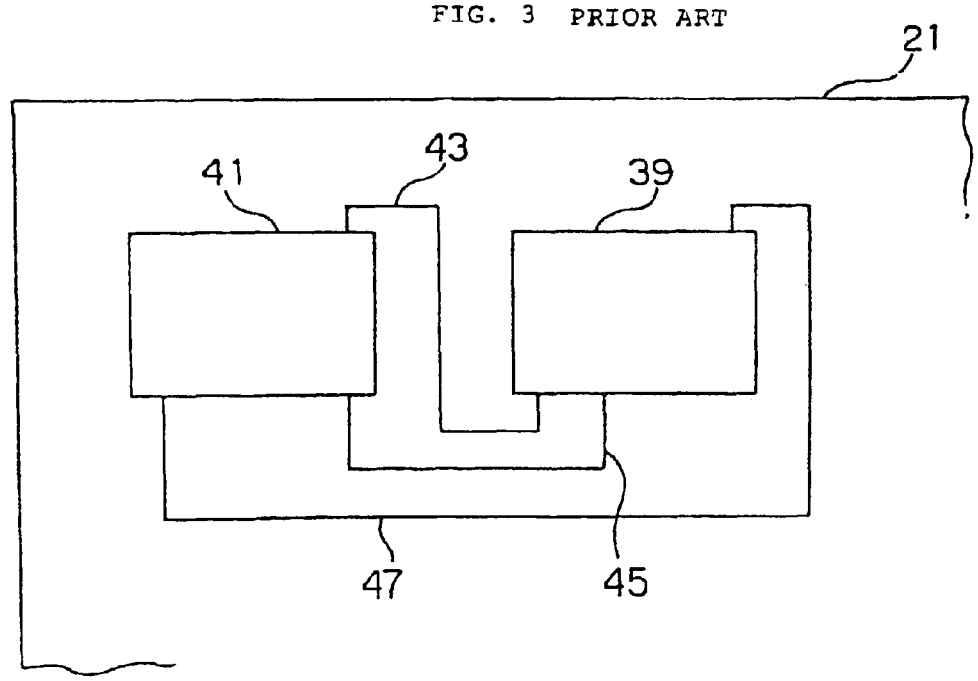
FIG. 3 is a plan view of a part of another example of the conventional electronic apparatus.

Referring to FIG. 3, another example of an electronic apparatus has LSI's 39 and 41 mounted on the surface of the printed circuit board 21 in the similar manner being described in connection with FIG. 2. The LSI's 39 and 41 are connected with each other by circuit conductors (patterns) 43, 45, and 47 which are formed on the surface of the printed circuit board 21.

Figure 4:
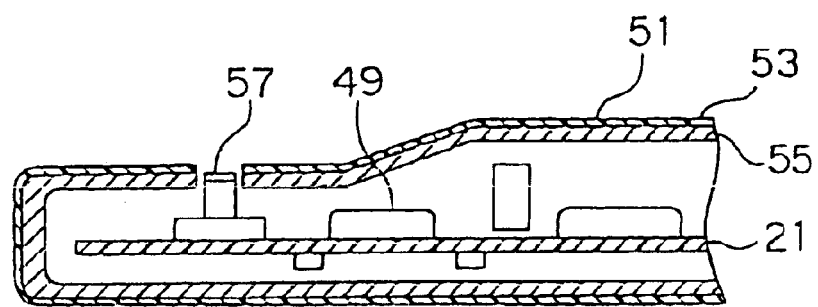
FIG. 4 is a sectional view of a part of still another example of the conventional electronic apparatus.

Referring to FIG. 4, the electronic device shown therein includes a printed circuit board 21 supporting thereon, an electronic part 49 of an active element radiating an inductive noise, and a case 51 as a storage body covering all over the printed circuit board 21. The case 51 has a shell portion 53 made of resin and a conductive layer 55 formed by applying a conductive paste inside the shell portion 53. In the case 51, mechanical parts 57 are mounted on the printed circuit board 21 in addition to the electronic part 49.

Now, description will be made as regards an electronic interference suppressing body, a composite magnetic material, and a method of producing them according to the present invention with reference to FIGS. 5 to 9.

In order to suppress a broadband noise, it is preferred to have a plurality of electromagnetic resonances. The plurality of electromagnetic resonances is caused from a plurality of anisotropic magnetic fields having different strength from each other.

Concretely, two means exist for realizing a plurality of anisotropic magnetic fields.

One means for obtaining the plurality of anisotropic magnetic fields is that a plurality of magnetic powders are mixed which have anisotropic magnetic fields (Hk) different in strength from each other in order to obtain a plurality of magnetic resonances which are different from each other.

Another means is that use is made of a single kind of powders which have a single kind of composition, monotounous particle size distribution, and a specific surface area of 0.3 m²/g or more. Herein, the monotonous particle size distribution has a distribution curve with a maximum value but without maximal and minimal values.

For changing anisotropic magnetic field in strength, four means exist fundamentally as follows.

First, one means is to control compositions of soft magnetic material, composition itself or in ratio of composition.

Second, another means is to control particle diameters of soft magnetic material.

Third, still another means is to use a magneto elastic effect, such as magnetostriction, residual stress or the like.

Fourth, yet another means is to invest an inductive magnetic anisotropy, which is due to heat treatment or shape of particle.

Flattening the powders with mechanical grinding makes progress in the similar manner being described (see Yoshida et al., "Permeability and electromagnetic-interferences characteristics of Fe—Si—Al alloy flakes-polymer composite" J. Appl. Phys., vol. 85, No. 8. p.p. 4636–4638,15 Apr. (1999), which will be hereinafter referred to as reference 1) and specific surface area of the powder increases in proportion to grinding time (reference 1). That is, magnetic powder can be obtained which has a different specific area by changing grain size.

It is difficult to give the specified value, because surface area realizing two resonances vary depending on the other factors giving an surface magnetic anisotropy, for example, strength of magnetoelastic effect, i.e. largeness of magnetostrictive constant, and residual strain of the powder.

It is considered that in powders mechanically ground and flattened have a large residual stress generated by mechanical grinding is so large that two resonances are observed in many cases.

The inventors produced experimentally various powders having different specific surface areas and examined magnetic properties of the powders. As a result, they found it out that a new resonance realizes in a side of high frequency when the powders has a specific surface area larger than a certain extent.

That is, not only a conventional resonance in a region depending on a composition, a shape, and a residual stress, but also another resonance realizes on the basis of the higher anisotropy. This phenomenon has easiness of realization different depending on largeness of magnetostrictive constant in a little, but is admitted when the specific surface area are more than about 0.3 m²/g.

This phenomenon is essentially different from one described above. The powder which has more than 0.3 m²/g in specific surface area become a binomial distribution for some reason and assumed to be one appeared by a realization of surface magnetic anisotropy, which caused from the fact that the volume of powder particles occupied in a vicinity of surface become too large size to be ignored.

Particle size distribution is monotonous which are used in the embodiment of the present invention. In the embodiment, examples are given about soft magnetic materials. Realization of two resonances in monotonous particles of the present invention is a phenomenon observed when specific surface area becomes large to a certain extent in the magnetic powders, for example, $Fe_3O_4$.

For two resonances considered to be comprised of the resonance caused by the surface magnetic anisotropy and the inherent resonance.

In addition, in the present invention, a monotonous magnetic powder will be defined as a magnetic powder which does not contain a mixture of different powder materials from each other but has a single kind of composition and monotonous particle size distribution.

In the present invention, any one of those means described above can be used to obtain a plurality of anisotropic magnetic fields. It is important to give a plurality of anisotropic magnetic fields so as to obtain a desired magnetic loss band. Particularly, an anisotropic magnetic field which gives a magnetic resonance at the lowest frequency is required to be set at a value which gives a magnetic resonance in a frequency region lower than a lower limit of a desired electromagnetic interference suppressing frequency band, considering that a dispersion of imaginary permeability (magnetic loss) occurs depending on decrease of real permeability.

The soft magnetic powder used in the present invention may typically be a powder which is obtained by grinding, drawing, tearing, or atomize-corning of soft magnetic metal with high permeability in a high frequency region, for example, iron-aluminum-silicon alloy (i.e. Sendust), iron-nickel alloy (i.e. permalloy), amorphous alloy, or the like. It is preferable that the powder is at least oxidized at the surface to electrically insulate particles of powder from each other so as to ensure non-conductivity of the composite magnetic material, which is an essential condition according to the present invention, in a state of highly packed powders.

Since the soft magnetic powder used in the present invention is oxidized at least on the surfaces thereof, the individual particles exists as being electrically isolated even at the high filling rate of the powder. Accordingly, not only deterioration of a frequency characteristic due to an eddy current loss as observed in a conductive bulk body is small, but also the reflection of electromagnetic waves on the surfaces due to impedance mismatch with the space becomes reluctant to occur, so that an excellent electromagnetic interference suppressing effect can be achieved at a high frequency region.

As other soft magnetic powder used in the present invention, a soft magnetic oxide material, such as a spinel type ferrite, a planar type ferrite, or the like can be used, and use can also be made of a mixture with the soft magnetic metal as described above.

As an organic binding agent to be used as a secondary material of the present invention, use is made of organic binder which contains a thermo-plastic resin such as chlorinated polyethylene, polyester resin, polyethylene resin, polyvinyl chloride resin, polyvinyl butyral resin, polyurethane resin, ABS resin, nitrile-butadiene rubber, and styrene-butadiene rubber, and copolymers thereof, or a thermosetting resin such as epoxy resin, phenol aldehyde resin, amide series resin, imide resin, or the like, for obtaining an effect the present invention aim at, that is, for obtaining excellent in flexibility and fire resistance. However, an organic binder to be used is not limited to this as far as the similar effect to it can be obtained.

There is no particular limitation to means for obtaining a composite magnetic material by kneading and dispersing the forgoing constituent element of the present invention. A preferable method may be selected based on a property of a binding agent to be used and facilitation of a process.

The composite magnetic material and the electromagnetic interference suppressing body using it according to the present invention has a plurality of anisotropic magnetic fields (Hk) of mutually different strengths so that a plurality of magnetic resonances appear at mutually different frequency regions. Thus, imaginary part permeabilities $\mu''$ appearing at mutually different frequency regions following the plurality of magnetic resonances are superimposed so that a wide band $\mu''$ dispersion characteristic can be achieved. The imaginary part permeability $\mu''$ is a magnetic loss term necessary for absorbing electromagnetic waves so that if values of $\mu''$ are large and extend over a wide band, and excellent electromagnetic interference suppressing effect appears.

The electromagnetic interference suppressing body according to the present invention is made of the composite magnetic material, which will be more concretely described as follows.

Description will be made as regards an example of a method of producing the composite magnetic material and the soft magnetic powder as a raw material thereof, which are made by mixing two kind of soft magnetic powder and used for the electromagnetic interference suppressing body of the present invention.

At first, a plurality of iron-aluminum-silicon alloy powders are prepared by the water-atomizing process to have different mean particle diameters, then spread and ground under various conditions by use of an attoritor and a pinmill, then put into and stirred in an organic solvent of hydrocarbon while introducing nitrogen-oxygen gas mixture with an oxygen partial pressure of 35% for 8 hours for a liquid-phase-slow-oxidation treatment, thereafter, classified to obtain resultant powders each of which has anisotropic magnetic fields different from each other. As a result of surface analyzing of the resultant powders, Al—O and Si—O bonds were clearly observed, that is, it was confirmed that oxide film is present on the surface of the powder samples.

Other sample powders were prepared by drying the spread and torn iron-aluminum-silicon alloy powders in an atmosphere of a reduced pressure and then vapor-phase-slow-oxidizing them in a nitrogen-oxygen gas mixture with oxygen partial pressure of 20%, and were also confirmed to have Al—O and Si—O bonds in the surface layers. Thus, it is noted that the surface oxidized soft magnetic powder useful in the present invention can be produced through not only the liquid-phase-slow-oxidation process but also gas-phase-slow-oxidation-process.

(Test Sample 1)

A composite magnetic material as shown in Table 1 below was prepared and formed into a film by the doctor blade method, then the film was hot-pressed and cured at 85° C. for 24 hours to obtain a test sample 1.

The test sample 1 was analyzed by a vibrating magnetometer and a scanning electron microscope, and it was thereby confirmed that its magnetization easy axis and a particle orientation were in a direction of the film surface of the test sample.

For evaluating properties for the electromagnetic interference suppressing body, measurement was performed as regards a $\mu$-f characteristic and the electromagnetic interference suppressing effect of the test sample.

TABLE 1

Test Sample 1 of the invention

| Component | Mixing Ratio |
|---|---|
| Flat Soft Magnetic Fine Powder (Fe—Al—Si Alloy) Fine Powder A Anisotropic Magnetic Field (Hk): 30Oe Frequency of Resonance (fr"): 140 MHz BET Specific Surface Area: 0.23 m²/g | 60 weight parts |
| Flat Soft Magnetic Fine Powder (Fe—Al—Si Alloy) Fine Powder B Anisotropic Magnetic Field (Hk): 135Oe Frequency of Resonance (fr"): 2000 MHz BET Specific Surface Area: 0.17 m²/g | 35 weight part |
| Polyurethane Resin | 8 weight parts |
| Hardening Agent (Isocyanate Compound) | 2 weight parts |
| Solvent (Mixture of Cyclohexanone and Toluene) | 40 weight parts |
| Total | 145 weight parts |

For measurement of $\mu$-f characteristic, a sample of composite magnetic material was prepared which was worked into a toroidal shape. The sample was inserted in a test fixture which forms an one-turn coil and was subjected to an impedance measurement from which $\mu'$ and $\mu''$ were obtained.

Figure 5:
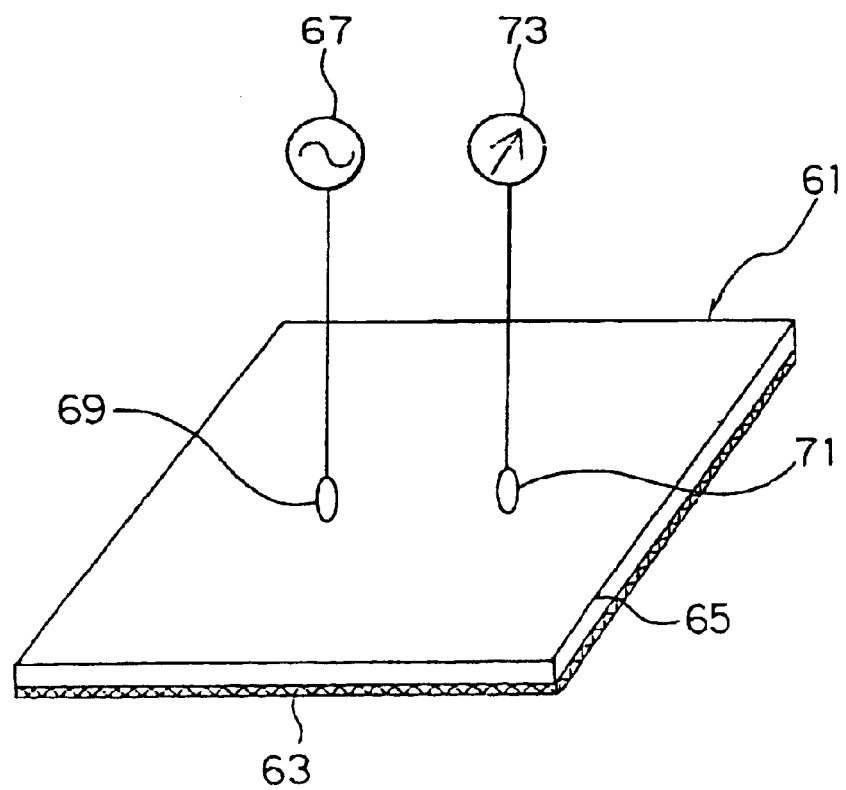
FIG. 5 is a schematic view of an evaluation test system for use in evaluation of electromagnetic interference suppressing body according to the present invention.

On the other hand, the evaluation of the electromagnetic interference suppressing effect was carried out in an evaluation system shown in FIG. 5. As a test sample of the electromagnetic interference suppressing body 61, a composite magnetic material 65 was used which had a thickness of 2 mm and each side length of 20 cm and was backed with a copper plate 63. Using an oscillator for electromagnetic wave source 67, electromagnetic field radiating and receiving small loop antennas 69 and 71 having a loop diameter of 1.5 mm were used for a wave source element and a receiving element. For measurement of a coupling level, a network analyzer (an electromagnetic strength measuring instrument) 73 was used.

(Test Sample 2)

A composite magnetic material as shown in Table 2 was prepared from which a test sample 2 was produced in the manner similar to the sample 1.

TABLE 2

Test Sample 2 of the invention

| Component | Mixing Ratio |
|---|---|
| Flat Soft Magnetic Fine Powder (Fe—Al—Si Alloy) Fine Powder C Anisotropic Magnetic Field (Hk): 35Oe Frequency of Resonance (fr"): 140 MHz BET Specific Surface Area: 0.21 m²/g | 30 weight parts |
| Flat Soft Magnetic Fine Powder (Fe—Al—Si Alloy) Fine Powder B Anisotropic Magnetic Field (Hk): 170Oe Frequency of Resonance (fr"): 5000 MHz BET Specific Surface Area: 0.26 m²/g | 65 weight part |
| Polyurethane Resin | 8 weight parts |
| Hardening Agent (Isocyanate Compound ) | 2 weight parts |
| Solvent (Mixture of Cyclohexanone and Toluene) | 40 weight parts |
| Total | 145 weight parts |

The test sample 2 was analyzed by a vibrating magnetometer and a scanning electron microscope, and it was thereby confirmed that its magnetization easy axis and particle orientation were in a direction of the film surface of the test sample.

(Comparative Sample 1)

A composite magnetic material as shown in Table 3 below was prepared in the manner similar to test sample 1 and obtained as a comparative sample 1.

The comparative sample 1 was analyzed by a vibrating magnetometer and a scanning electron microscope, and was confirmed to be magnetically isotropic.

TABLE 3

Comparative sample 1

| Component | Mixing Ratio |
|---|---|
| Flat Soft Magnetic Fine Powder (Fe—Al—Si Alloy) Fine Powder E | 30 weight parts |

TABLE 3-continued

Comparative sample 1

| Component | Mixing Ratio |
|---|---|
| Anisotropic Magnetic Field (Hk): 20Oe Frequency of Resonance (fr"): 3500 MHz BET Specific Surface Area: 0.15 m²/g | |
| Polyurethane Resin | 8 weight parts |
| Hardening Agent (Isocyanate Compound) | 2 weight parts |
| Solvent (Mixture of Cyclohexanone and Toluene) | 40 weight parts |
| Total | 80 weight parts |

Figure 6:
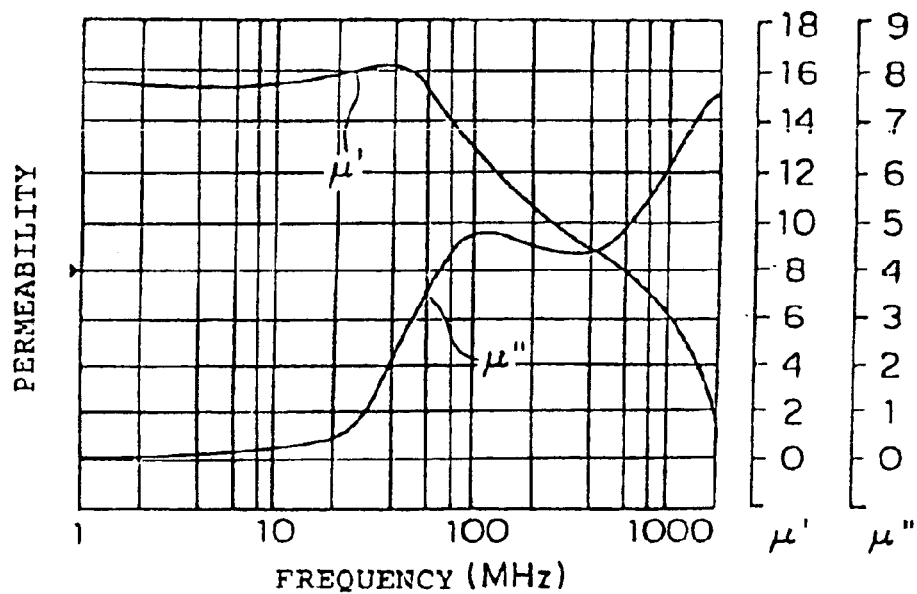
FIG. 6 is a graph illustrating a $\mu$-f characteristic curve of a composite magnetic material of a test sample 1 according to the present invention.
Figure 7:
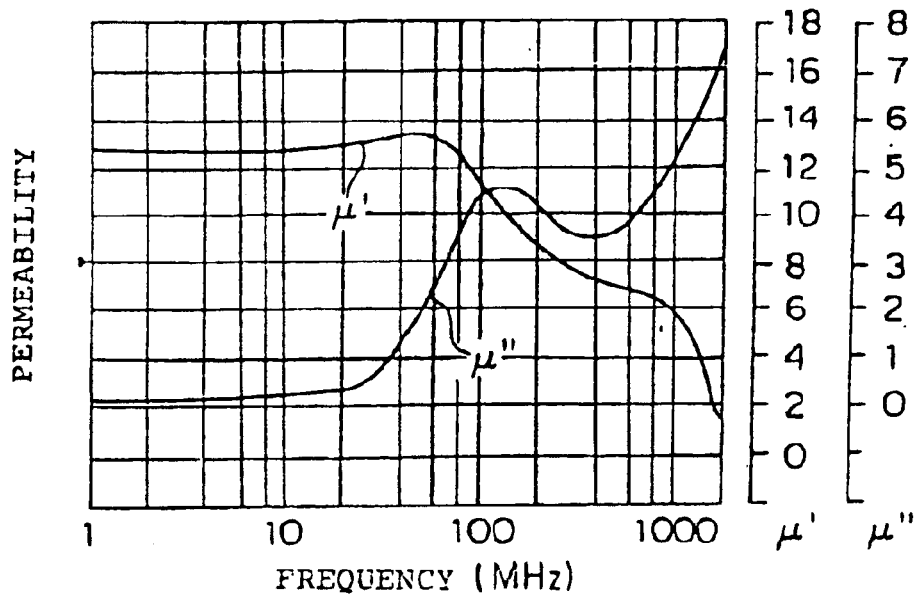
FIG. 7 is a graph illustrating a $\mu$-f characteristic of a composite magnetic material of another test sample 2 according to the present invention.
Figure 8:
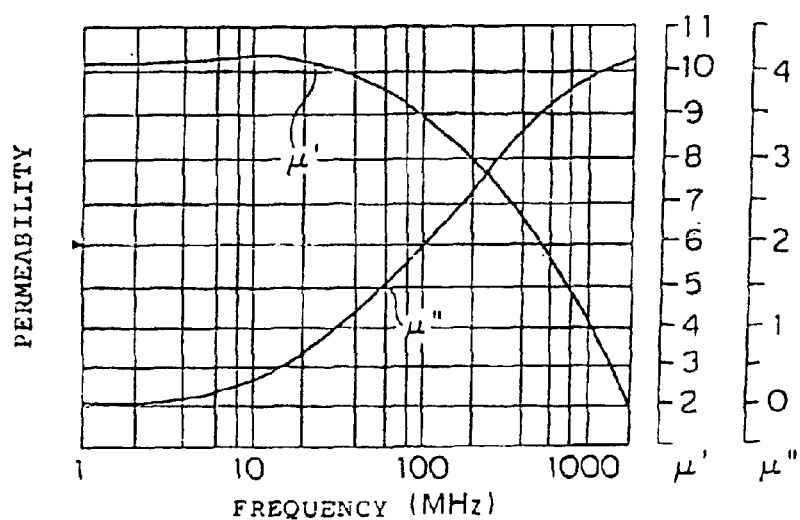
FIG. 8 is a graph illustrating a $\mu$-f characteristic of a comparative sample 1 of a conventional magnetic material.

The measured $\mu$-f characteristics of the test samples 1 and 2, and comparative sample 1 are shown in FIGS. 6–8.

Referring to FIGS. 6 and 7 showing $\mu$-f characteristics of test samples 1 and 2 of the present invention, respectively, it is understood that the test samples have large values of $\mu''$ over a wide band and have bimodal magnetic resonances of $\mu''$ in a high frequency region.

On the other hand, the known comparative sample as shown in FIG. 8 as a comparative sample has a non-wide range of the $\mu''$ distribution which composite magnetic materials generally have.

It will be understood from those results that test samples 1 and 2 of the present invention have a high magnetic loss characteristics over a wide band in a high frequency region.

Table 4 shows the powder packing ratio, the surface resistance, the $\mu''$ distribution, and electromagnetic interference suppressing effect of each of those samples. Herein, the surface resistance is a value measured by ASTM-D-257 method, and the electromagnetic interference suppressing effect is represented by a signal attenuation value on the base of a copper plate as a reference (0 dB).

Table 4 teaches the effect as described below.

Test samples 1 and 2, and comparative sample 1 have surface resistance values of $10^7$ to $10^8$ Ω, and this means that the composite magnetic material is made non-conductive by the use of the magnetic powder having at least oxidized surface and can suppress the surface reflection of the electromagnetic wave due to the impedance mismatching in use of the conductive material or a bulk of magnetic metal.

Moreover, although each of test samples 1 and 2 is lower than the comparative sample 1 in the packing ratio, it is excellent in the electromagnetic interference suppressing effect. Therefore, it is understood that the extended effect of $\mu''$ distribution in the present invention is very effective for the electromagnetic interference suppression.

TABLE 4

| | | Sample 1 | Sample 2 | Comparative Sample 1 |
|---|---|---|---|---|
| Packing Ratio | | 38% | 33% | 55% |
| Surface Resistivity | | $7 \times 10^7$ Ω | $9 \times 10^7$ Ω | $4 \times 10^7$ Ω |
| $\mu''$ Distribution | | wide | wide | narrow |
| Signal Attenuation | 800 MHz | 7.0 dB | 6.5 dB | 4.0 dB |
| | 1.5 GHz | 8.0 dB | 7.5 dB | 4.5 dB |

In addition, surface-oxidation of the soft magnetic materials used in the present invention brings about other effects than that as described above.

For example, by control of powder surface oxide layer in thickness, a magnetic layer can be varied in thickness so that it is possible to control a value of the anisotropic magnetic field (Hk).

Next, description will be made as regards an embodiment showing a realization of two resonances by means of enlarging a specific surface area of the magnetic powders and using differentiation (non simplification) in the following samples 3 to 5.

(Sample 3)

Figure 9:
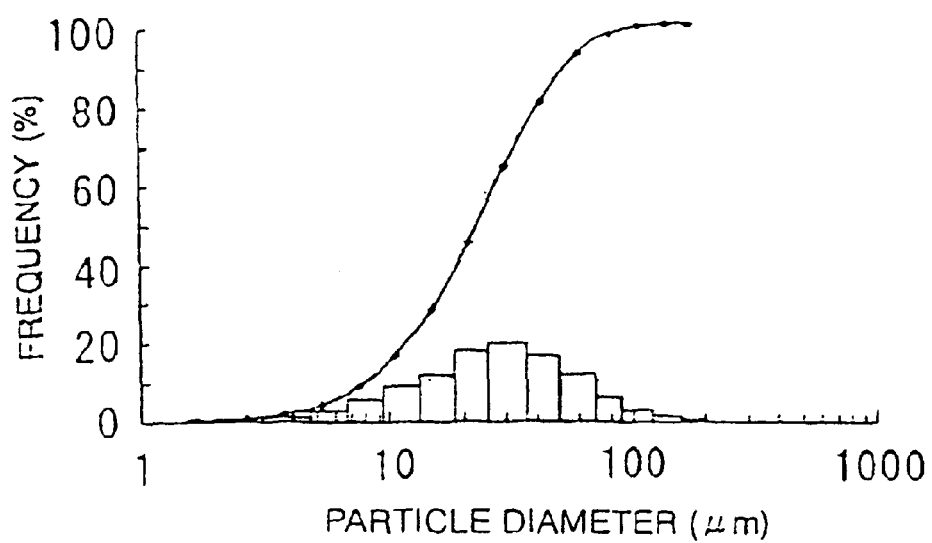
FIG. 9 is a graph showing the particle diameter distribution of the Fe—Al—Si alloy powder.
Figure 10:
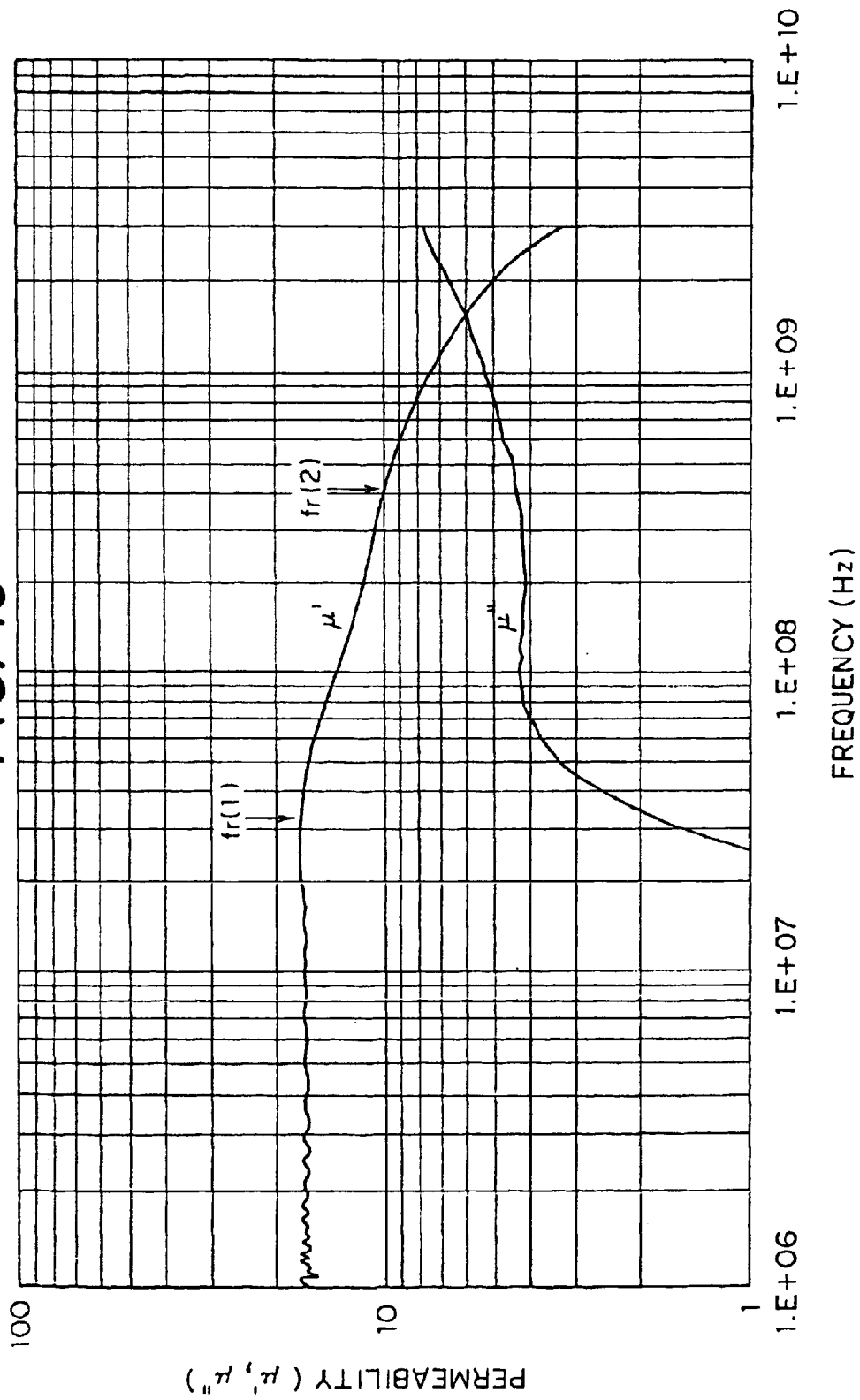
FIG. 10 is a graph illustrating a $\mu$-f characteristic curve of a test sample 3 of a composite magnetic material according to the present invention.

As magnetic powder H, Fe—Si—Al flat powder having specific surface area of 0.8 m$^2$/g is made. The magnetic powder has anisotropic magnetic fields (Hk) of 25 and 171 Oe, and frequencies of resonances (fr") of 108 and 2800 MHz, respectively. The flat powder are mixed and made to form a sheet shape of sample 3 of a composite magnetic material. The used magnetic powder H has been compressed to have a grain size distribution a single dispersion as shown in FIG. 9. Herein, FIG. 9 shows the particle diameter distribution of the Fe—Al—Si alloy powder. The particle diameter distribution curve shown in the graph has a single maximum value without any other peaks and troughs, indicating that the alloy powder has a unimodal particle diameter distribution. In addition, the particle diameter distribution curves of the other alloy powders also show similar patterns. An assay of the powder suggested that the surface of the particles of the alloy powder contains an excess amount of iron as compared with the bulk composition of the starting material. The permeability of the obtained sample is shown in FIG. 10, sample 3 of the invention. From the result shown in FIG. 10, it is understood that two resonance points are realized in the powders of relatively large specific surface area although the powders has a single particles size distribution that as a result, dispersion of magnetic loss term $\mu$" ranged over wide band, magnetic material can be obtained which is preferable as noise countermeasure material.

(Comparative Sample 2, and Samples 4 and 5 of the Invention)

Three kinds of flat magnetic powders having a composition of, by weight, Ni80%-Fe20% and surface areas different from one another are made, mixed in the similar manner to other samples to form to seat shaped test samples 4 and 5, and comparative sample 2 of the composite magnetic materials.

In the Ni—Fe flat powders used, B.T.E. specific areas are 0.13 m$^2$/g in magnetic powder I, 0.47 m$^2$/g in magnetic powder J, and 0.61 m$^2$/g in magnetic powder K, respectively.

The comparative sample 2 using the magnetic powder I has an anisotropic magnetic fields (Hk) of 80 Oe and a frequency of Resonance (fr") of 450 MHz. The sample 4 of the invention using the magnetic powder J has anisotropic magnetic fields (Hk) of 31 and 124 Oe and frequencies of Resonance (fr") of 123 and 1461 MHz, respectively. The sample 5 of the present invention using the magnetic powder K has anisotropic magnetic fields (Hk) of 27 and 152 Oe and frequencies of Resonance (fr") of 112 and 3135 MHz, respectively.

Figure 11:
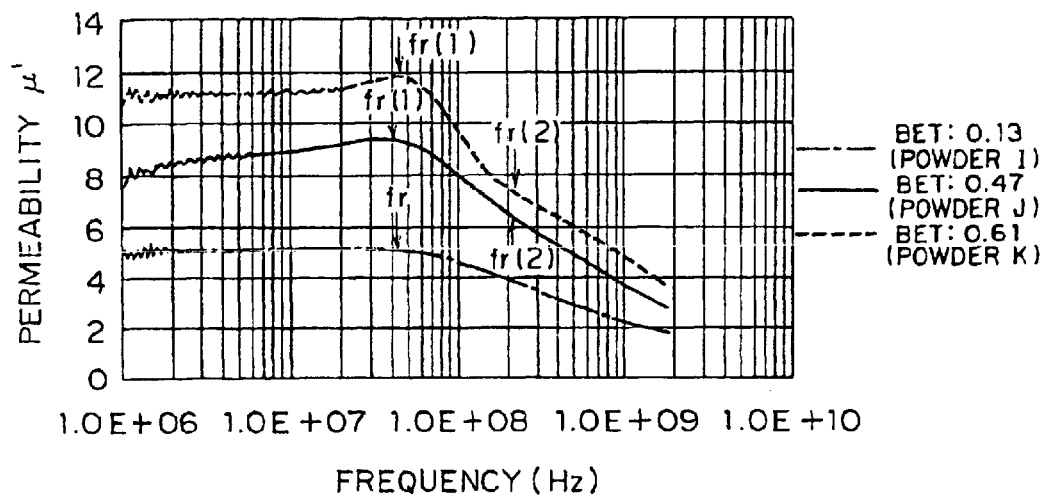
FIG. 11 is $\mu'$-f characteristic curves of comparative sample 2 and test samples 4 and 5 of a composite magnetic material according to the present invention.
Figure 12:
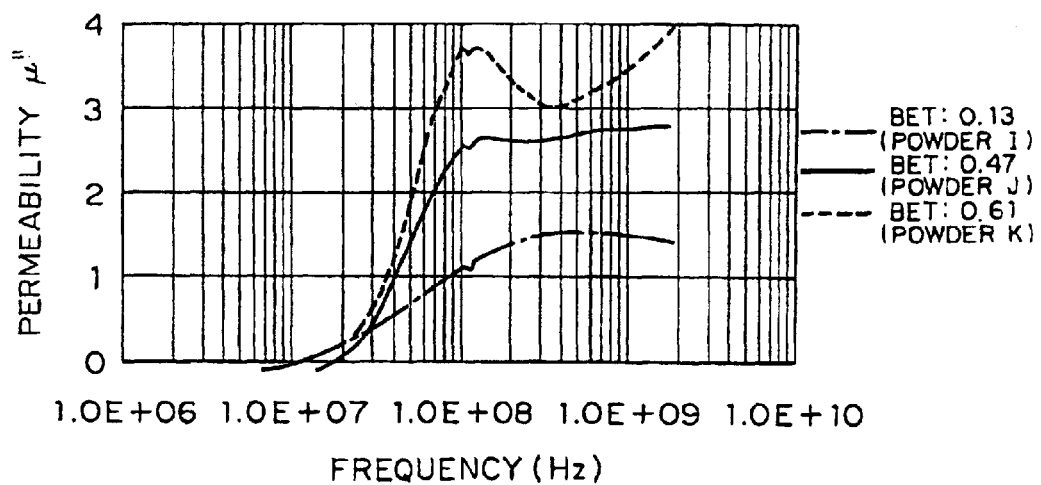
FIG. 12 is a graph illustrating $\mu''$-f characteristic curves of comparative sample 2 and test samples 4 and 5 of FIG. 11.

In all of the magnetic powders, I to K, it is confirmed that the particle size distribution is a single dispersion. Permeability properties of the obtained samples are shown in FIGS. 11 and 12. From the result shown in FIGS. 11 and 12, it is observed in the powder I having a relatively small specific surface area that permeability $\mu$" curve has only one magnetic resonance point. On the other hand, it is observed in magnetic powder J having relatively large specific surface area that permeability $\mu$' and also magnetic loss term$\mu$" curve has two magnetic resonance points although the powder J has a single particle size distribution.

Furthermore, it is clearly observed in the magnetic powder K having more large specific area than the magnetic powder J that that permeability $\mu$' curve has two magnetic resonance points. As a result, magnetic loss term $\mu$" has two distribution and ranges over wide band in a similar manner to permeability $\mu$'.

The examples of flat shape magnetic powders have been described. As above-mentioned, it is considered that the phenomenon realizing two magnetic resonances owing to surface magnetic anisotropy.

Therefore, it may be well that the powders do not have a flat shape.

Such examples will be described as follows.

(Comparative Samples 3 and Sample 6 of the Invention)

Figure 13:
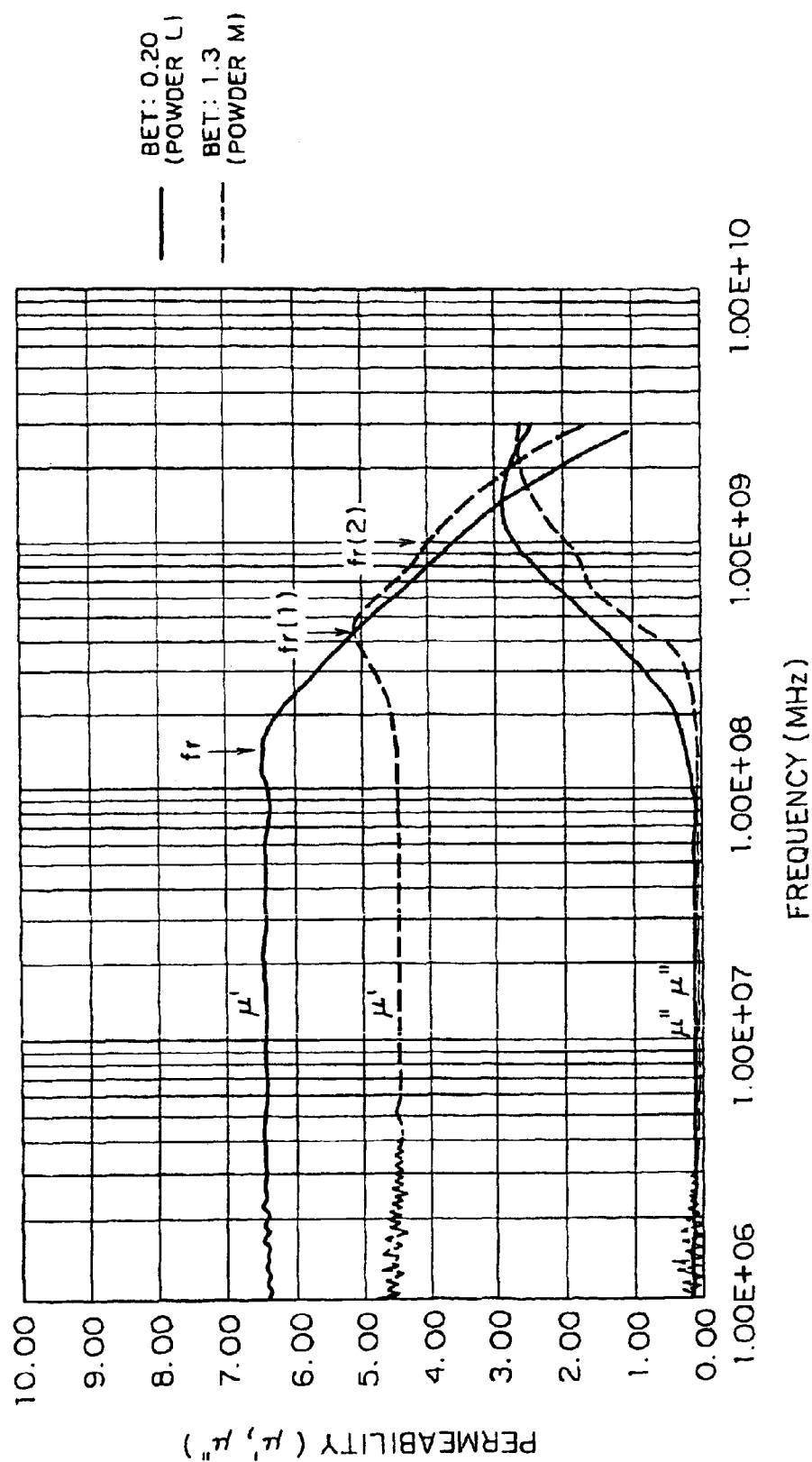
FIG. 13 is a graph illustrating $\mu$-f characteristic curves of comparative sample 3 and test sample 6 of a composite magnetic material according to the present invention.

As magnetic powder, magnetite (Fe$_3$O$_4$) powders L and M, which have an indefinite shape and in which a particle size distribution represent a single dispersion. are made, mixed in the similar manner to other samples to form to seat shape sample 6 of the present invention and comparative sample 3 of composite magnetic material. In connection with the used magnetite powders, BET specific surface areas are 0.2 m$^2$/g in the magnetic powder L and 1.3 m$^2$/g in the magnetic powder M, respectively. Permeability properties of the samples obtained are shown in FIG. 13. From the result shown in FIG. 13, permeability $\mu$ has only one resonance portion in the powder L having relatively small specific surface area.

Alternately, the permeability $\mu$' has two resonances in the powder K having relatively large specific area on account of single particle size distribution.

The comparative sample 3 using the magnetic powder L has an anisotropic magnetic field (Hk) of 119 Oe and a frequency of Resonance (fr") of 1293 MHz. The sample 6 of the present invention using the magnetic powder M has anisotropic magnetic fields (Hk) of 91 and 140 Oe and frequencies of Resonance (fr") of 607 and 2284 MHz, respectively.

As shown above in the examples of samples 3 to 6, a new resonance realizes in a high frequency range when surface area becomes a certain largeness even if the powder has a single composition and a single particle size distribution.

Another example of a composite magnetic body by the present invention will be shown.

As shown in Table 5 below, 80 weight parts of soft magnetic powder (Fe—Al—Si alloy, mean particle diameter: 35 $\mu$m, aspect ratio: not less than 5) and 0.8 weight parts of a titanate coupling agent are agitated by a mixer so that the soft magnetic powder is subjected to the coupling in advance. Then, as shown in Table 5, 80 weight parts of the soft magnetic powder subjected to the coupling and 20 weight parts of an organic agent (chlorinated polyethylene) are kneaded by a kneader to obtain a composite magnetic body.

Then, the obtained composite magnetic body is passed through between rolls arranged in parallel to be rolled and thus formed into a sheet. Through this, an electromagnetic interference suppressing body having excellent flexibility and fire resistance can be obtained.

TABLE 5

| | |
|---|---|
| Soft magnetic powder Fe—Al—Si alloy<br>Mean particle diameter: 35 μm<br>Aspect ratio: >5 | 80 weight parts |
| Titanate coupling agent | 0.2 weight parts |
| Organic binding agent<br>(chlorinated polyethylene) | 20 weight parts |

Furthermore, the composite magnetic material and the electromagnetic interference suppressing body using the same of the present invention can easily be provided with flexibility as will be easily understood from their structures, so that it is possible to deal with a complex shape and severe vibration or shock proof.

As mentioned above, the composite magnetic material according to the present invention and the electromagnetic interference suppressing body using the same have a plurality of anisotropic magnetic fields (Hk) different from each other to thereby cause a plurality of magnetic resonances in different frequency regions so that the $\mu''$ distribution can be obtained in a wide band. Since the imaginary permeability $\mu''$ is a term of the magnetic loss required to absorption of the electromagnetic wave, the excellent electromagnetic interference suppressing effect is brought about by the large value of $\mu''$ over the wide band. As a result, the electromagnetic interference suppressing body of a thin film can be obtained which is effective for suppressing interference of the electromagnetic waves within high frequency electronic devices including mobile communication terminals.

Now, description will be made as regards examples of electromagnetic interference members using the composite magnetic material according to the present invention.

(Examples Applied to a Printed Circuit Board)

FIRST EXAMPLE

Figure 14:
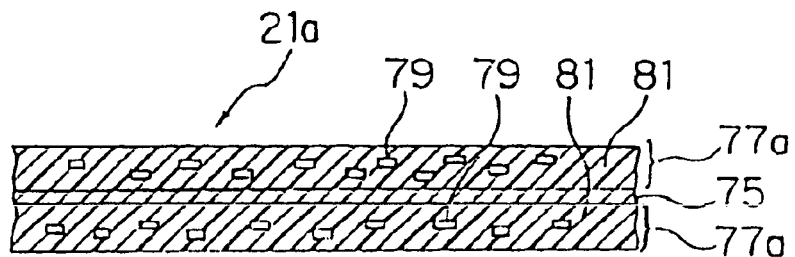
FIG. 14 is a cross sectional view illustrating a part of a printed circuit board according to a first example of the present invention.

Referring to FIG. 14, a printed circuit board 21 a is applied with the electromagnetic interference suppressing body using the composite magnetic material of the present invention. The printed circuit board are provided with the conductive circuit patterns 23, 25, and 29 and others thereon, which are omitted in the figure, in the similar manner as the conventional printed circuit board shown in FIG. 1.

The printed circuit board 21a of a first example, itself, has a different structure from the conventional one. That is, the first example of the printed circuit board 21a has a conductive support plate or a conductive soft magnetic support layer 75. The printed circuit board 21a, further, has a pair of composite magnetic layers 77a on both sides of the conductive support layer 75. The composite magnetic layer 77a comprises soft magnetic powder particles 79 and an organic binder 81. The composite magnetic layer 77 have a plurality of anisotropic magnetic fields and a plurality of magnetic resonances in a magnetic loss term. The organic binder is contained for forming a matrix of the composite magnetic layer 77a.

SECOND EXAMPLE

Figure 15:
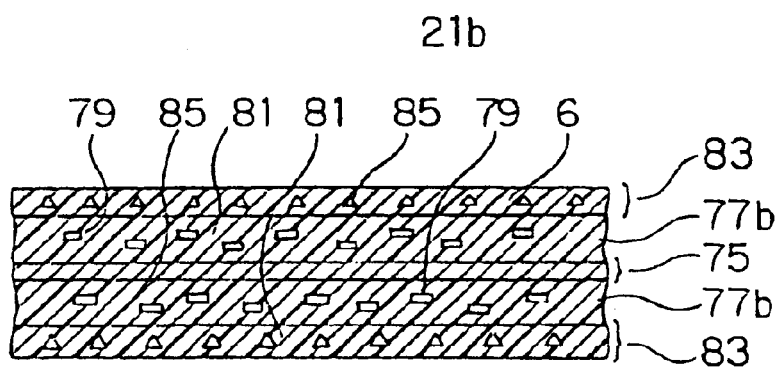
FIG. 15 is a cross sectional view of a part of the printed circuit board according to a second example of the present invention.

Referring to FIG. 15, a second example of the printed circuit board comprises a conductive support layer 75 and composite magnetic layers 77b formed on both sides of the conductive support layer 75. The printed circuit board 21b further has a pair of dielectric layers 83 on both sides of the composite magnetic layers 77b in a different structure from that shown in FIG. 14. Accordingly, the second example of the printed circuit board has a structure wherein composite magnetic layers 77b are interposed between the conductive support layer 75 and each of dielectric layer 83. The composite magnetic layer 77b is similar to the first example and have a plurality of anisotropic magnetic fields and a plurality of magnetic resonances in the magnetic less term. Furthermore, the composite magnetic layer 77b also contains an organic binder 81 forming its matrix. Each of the dielectric layers 83 comprises a dielectric powder 85 and an organic binder 81. The organic binder 81 is contained for forming a matrix of each of the dielectric layers 83.

THIRD EXAMPLE

Figure 16:
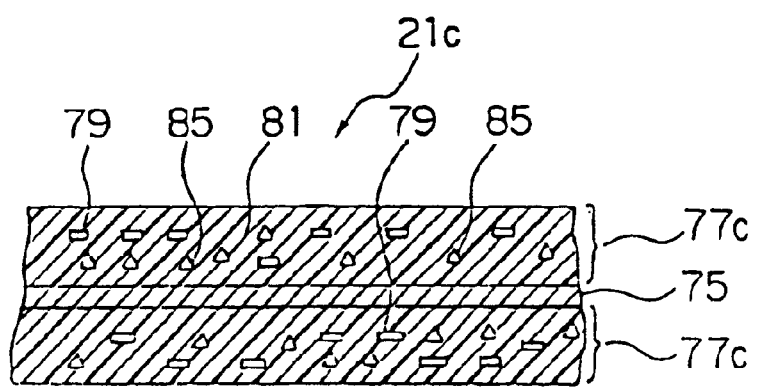
FIG. 16 is a cross sectional view of a part of a printed circuit board according to a third example the present invention.

Referring to FIG. 16, a third example of the printed circuit board comprises a conductive support layer 75 and composite magnetic layers 77c formed on both sides of the conductive support layer 75 (which is a similar reference number to the conductive support plate). Each of the composite magnetic layers 77c contains a soft magnetic powder 79, a dielectric powder 85 and an organic binder 81. The composite magnetic layer 77c has a different anisotropic magnetic fields in a similar manner to the first and second examples.

In the first to the third examples as mentioned above, the conductive support plate or conductive soft magnetic support layer 75 may be, for example, a conductive plate, a conductive mesh plate, or a woven fabric of conductive fibers, a metal plate such as a copper thin plate, stainless steel thin plate, aluminum thin plate and others, or a so called punched metal plate having fine holes formed in them, an expanded metal plate formed by fine-slitting a thin plate and then expanding it, or a metallic netting plate formed by weaving thin metallic wires into a net.

In the same system, if the material is replaced by soft magnetic permalloy or iron-silicate steel, it is expected to improve electromagnetic interference suppressing effect in a relatively low frequency region. Therefore, selection should be carried out in dependence of the use.

On the other hand, the conductive support layer 75 (or conductive soft magnetic support body) can be a sheet made from a metallic powder such as silver, copper, permalloy, silicon-steel, and others, a conductive carbon black, or conductive titanium oxide, kneaded with and dispersed into organic binder 81.

Furthermore, the conductive support layer 75 may be one in which a conductive layer or a conductive soft magnetic layer is formed on one or both surfaces of an insulating substrate by evaporation or plating.

Moreover, the dielectric powder 85 used for forming the dielectric layer 83 is preferably one which has a high dielectric coefficient in a high-frequency region and has a relatively flat frequency response of the dielectric characteristic. Typical examples are preferable barium titanate ceramics, zirconium titanate ceramics, and lead perovskite ceramics.

As the soft magnetic powder 79 having different anisotropic magnetic fields from each other in strength and realizing two resonances in a high frequency region, the ones shown in Tables 1 and 2 can be used as shown in Example 1 which are made by mixing two kind of the magnetic powder. While the ones shown in other samples can also be used which have a relative larger specific surface area.

As the organic binder 81 used for forming the composite magnetic layers 77a, 77b, and 77c, use can be made of a thermoplastic resin such as polyester resin, polyvinyl chloride resin, polyvinyl butyral resin, polyurethane resin, cellulose resin, nitrile-butadiene rubber, or styrene-butadiene rubber, or copolymers thereof, or a thermosetting resin such as epoxy resin, phenol resin, amide resin, and imide resin.

Furthermore, as a reinforcement materials of the printed circuit board, use is made of a paper base materials such as linters paper, kraft paper, or the like, a glass base materials such as glass cloth, glass mat, glass paper, quartz fiber or the like, and a plastic fiber substrate such as polyester fiber, amide fiber or the like, from which selection should preferably be made considering the electric or other characteristics.

As will be understood from the components, the printed circuit board of the present invention can easily be provided with flexibility to, thereby, deal with a complex shape form.

As described above, it is possible according to this invention to provide a highly reliable printed wiring board which has electromagnetic wave shielding effect and electromagnetic wave absorption effect and which can suppress the influence of the external electromagnetic wave and radiation of the electromagnetic wave from the circuit.

The printed circuit board of the present invention is a printed circuit board having a structure where composite magnetic layers are formed on both sides of a conductive support plate, on which wiring conductive patterns are formed. In another printed circuit board of the present invention, composite magnetic layers are formed on both sides of the conductive support plate and a dielectric layer is formed on at least one surface of those composite magnetic layers to form the printed circuit board on which the wiring conductive patterns are formed.

In detail, the conductive support layer which forms a part of the printed circuit board functions the shielding effect similar to the electromagnetic wave shielding circuit board substrate at a surface opposing a surface of the circuit board which plays a part of the noise source, and therefore, the electromagnetic interference can be suppressed. Further, a secondary electromagnetic coupling due to undesired radiation generated by reflection which is caused at the side of the printed circuit board which has a noise source is suppressed by the composite magnetic layer which comprises a soft magnetic powder and organic coupling agent. When the soft magnetic powder has the flat shape or needle like shape, the shape magnetic anisotropy occurs to thereby increase of the complex magnetic permeability based on the magnetic resonance within the high frequency region. Moreover, the soft magnetic powder is flat or needle-like and, therefore, the shape magnetic anisotropy occurs and the complex permeability due to the magnetic resonance is increased in the high frequency region, so that the undesired radiation can be effectively absorbed and suppressed. The composite magnetic layer can be made from a conductive soft magnetic metal by grinding into fine powder and then kneading with and dispersed into a insulating organic coupling agent to form an insulating layer. Further, the composite magnetic material is an electric insulator so as to realize the impedance matching with the space and suppress efficiently undesired electromagnetic wave without causing the reflection.

(Examples Applied to Electronic Apparatus)

Next, description will be made as regards examples applied to electronic devices of electromagnetic wave suppressing body according to the present invention with reference to FIGS. 17 to 19.

FOURTH EXAMPLE

Figure 17:
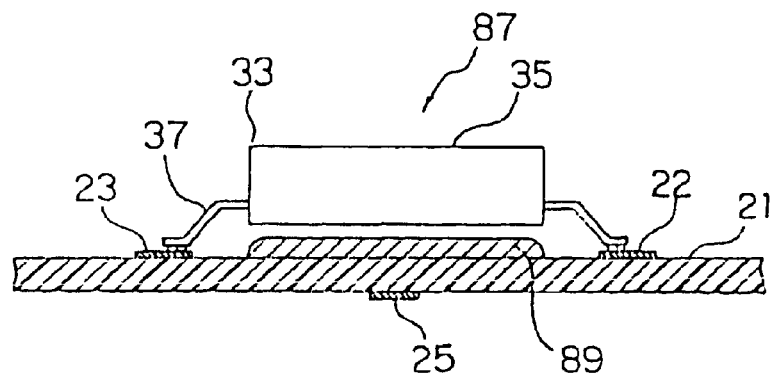
FIG. 17 is a cross sectional view of a part of an electronic apparatus according to a forth example of the present invention.

Referring to FIG. 17, an electronic apparatus 87 of a fourth example differs from the conventional one shown in FIG. 2 in the following point. Between the surface of the printed circuit board 21 and the undersurface of LSI device 35, an composite magnetic layer 89 is disposed on the surface of the printed circuit board 25. In the forth embodiment shown in FIG. 17, the composite magnetic layer 79 is located just below the LSI device 35.

When the composite magnetic layer 89 is mounted as described above, the composite magnetic layer 89 concentrates magnetic fluxes due to high frequency electromagnetic fields generated by the LSI 35. As a result, an inductive coupling between the LSI 35 and the conductive patterns 22, 23, and 25 is decreased so that noise generated from the printed circuit board can effectively be suppressed.

FIFTH EXAMPLE

Figure 18:
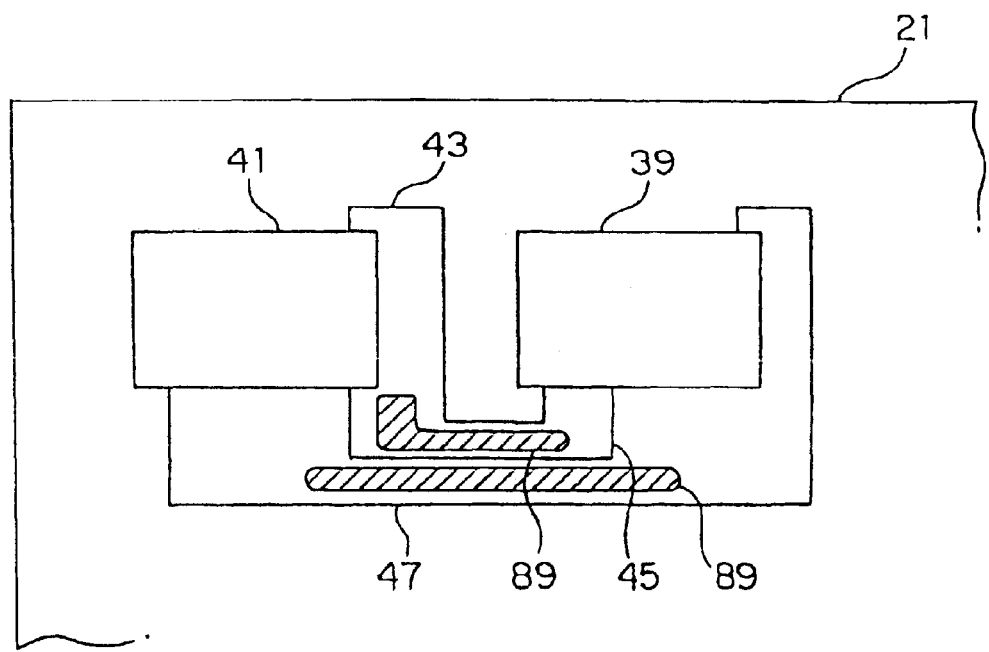
FIG. 18 is a plan view of a part of an electronic apparatus according to a fifth example of the present invention.
Figure 19:
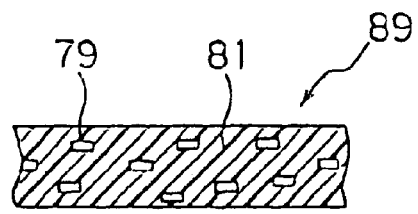
FIG. 19 is a cross sectional view of a part of a composite magnetic layer of FIGS. 17 and 18.

Referring to FIG. 18, an electronic apparatus of a fifth embodiment has the structure almost similar to the conventional one in FIG. 3, but the electronic apparatus differs from the conventional one in the following point.

On the surface of the printed circuit board 21, the composite magnetic layers 89 are disposed between the circuit conductors 43 and 45 and between the circuit conductors 45 and 47, respectively. The composite magnetic layers 79 attract and absorb magnetic fluxes generated by the high frequency current conducted through the circuit conductor. As a result, a crosstalk among the circuit conductors 43, 45, and 47 are suppressed.

The composite magnetic layer 89 will be described in detail with reference to the FIG. 19. As shown in FIG. 19, the composite magnetic layer 89 comprises a soft magnetic powder 79 and an organic binder 81. In detail, the soft magnetic powder 79 is homogeneously dispersed into the organic binder 81 as shown in the figure. Herein, the soft magnetic powder 79 has a plurality of different anisotropic magnetic fields.

For the soft magnetic powder 79, use is made of a powder as claimed in the present invention. The soft magnetic powder is not limited to ones described in the embodiment. The organic binder 81 may be a thermoplastic resin such as polyester resin, polyvinyl chloride resin, polyvinyl butyral resin, polyurethane resin, cellulose resin, nitrile-butadiene rubber, styrene-butadiene rubber or copolymers thereof, and a thermosetting resin such as epoxy resin, phenol resin, amide resin, or imide resin.

An example of producing the above-described electronic device will be described in the simple manner.

On a part of the circuit board on which an active element is mounted and on another part of the circuit board between the circuit conductors in parallel to each other, the composite magnetic material shown in Table 1 was printed, thereafter dried and cured. As a result, the composite magnetic layers 89 were formed with a thickness of 0.3 mm on the printed circuit board. The composite magnetic layer 89 is analyzed by use of a vibrating magnetometer and a scanning electron microscope, and it was thereby confirmed that the magnetization easy axis and the magnetic particle orientation are in a direction of a surface of the sample. On the printed circuit board with the composite magnetic layer thus formed, the electronic parts were mounted to form a circuit which was, in turn, operated. In the condition, strength of an electromagnetic field was measured under the printed circuit board by the spectrum analyzer to confirm a suppressing effect of an electromagnetic interference. As a result, it was understood that the use of printed circuit board with the composite magnetic layers 89 suppresses an electromagnetic field over a wide band at an opposite side of the printed circuit board with active element (LSI) mounted, as well as reduces a crosstalk between conductors adjacent to each other.

Thus, the electromagnetic interference can effectively be suppressed by locating the composite magnetic layer on a part of the circuit board where a problem of undesired radiation occurs.

In addition, it will be noted from the above-described examples of the present invention that a flexibility can be given to the composite magnetic layer so as to enable to deform into a complex shape as well as resist against mechanical shock.

By forming the composite magnetic layer between the active element and the printed circuit board and by forming the composite magnetic layer between the wiring conductors, increase of an electromagnetic coupling due to undesired radiation is suppressed by the composite magnetic layers. Herein, the composite magnetic layer has a soft magnetic powder and dispersing into an organic binder. The soft magnetic powder is in any particle shape as far as magnetic anisotropy may be realized thereby so that the complex permeability increases due to a plurality of magnetic resonances over a high frequency region to thereby effectively absorb and suppress an undesired radiation component of electromagnetic wave.

In the present invention, the composite magnetic materials are disposed between the active element as a noise source and the printed circuit board and also the composite magnetic materials or substance are, if desired, disposed between the circuit conductors, as described above, so that a mutual interference caused by an electromagnetic induction and an undesired electromagnetic wave are effectively suppressed without use of filters or the like to thereby enable to advantageously realize miniaturization and weight-lightening. As a result, an electromagnetic interference can be suppressed in high frequency devices including mobile communication terminals.

SIXTH EXAMPLE

Figure 20:
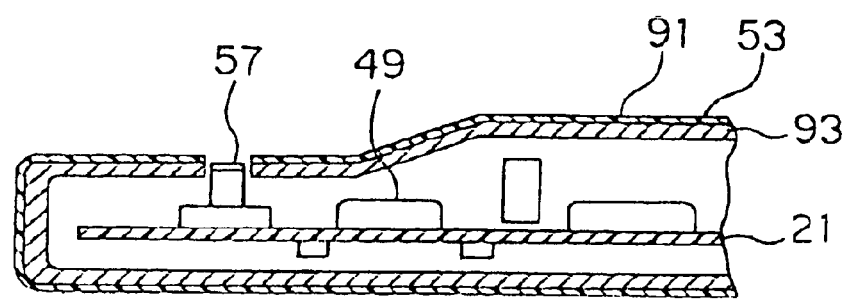
FIG. 20 is a cross sectional view of a part of an electronic apparatus according to a sixth example of the present invention.

Referring to FIG. 20, the electronic apparatus shown therein has the structure similar to the conventional electronic apparatus shown in FIG. 4 except a structural difference of the case. In detail, the case 91 has an electromagnetic interference suppressing body 93 inside the outer shell 53. In the electronic device, the electronic interference suppressing body 93 has a thickness of 0.5 mm.

In the electronic apparatus, electromagnetic interference suppressing body 93 attracts magnetic fluxes due to a high frequency electromagnetic field generated by an electronic part 49 and reduces an outward radiation noise and/or an induction coupling to the other electronic parts mounted adjacent to each other on the printed circuit board 21 to suppress generation of an inductive noise which is an undesired electromagnetic radiation. As a result, a mutual interference between the parts and a magnetic induction between power lines and signal lines are restrained in the circuit on the printed circuit board 21 to prevent an electromagnetic obstacle such as erroneous operation.

Figure 21:
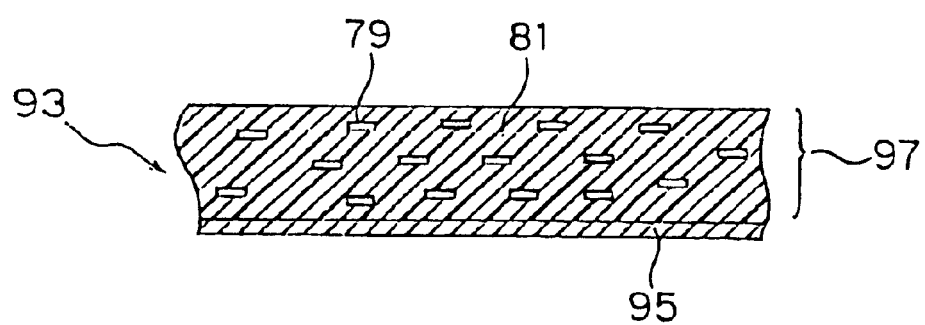
FIG. 21 is a cross sectional view of the composite magnetic material layer illustrated in FIG. 6.

FIG. 21 is a partially cross sectional view of a basic structure of the electromagnetic interference suppressing body 93. The electromagnetic interference suppressing body 93 comprises a conductive or insulating support 95 and an composite magnetic layer 97. The composite magnetic layer 97 comprises an organic binder 81 and a soft magnetic powder 79 dispersed in the organic binder 81 which powder consists of powder having anisotropic magnetic fields different from each other. The soft magnetic powder 79 is homogeneously dispersed into the organic binder 81, as shown in the figure.

In the electromagnetic interference suppressing body 93, when the support body 95 is conductive, the support body 95 may be one selected from the group of a conductive plate, a conductive netting plate, and a conductive fiber textiles. In the case, it is preferable that the case 91 may be formed of a non-metallic material, such as resin or the other.

On the other hand, when the support body 95 is of insulator in the electromagnetic interference suppressing substance 93, the support body 95 may be one selected from the group of an insulating plate, a insulating netting plate, and an insulating fiber textiles. In this case, it is preferable that the case 91 may be formed of metallic material, coated with a conductive paint, or formed with a conductive film by vaporizing deposition.

For the soft magnetic powder, use is made of a powder as claimed in the present invention which is not limited to ones described in the embodiments.

Furthermore, for the organic binder 81, use of made of a thermal plastic resin such as polyester resin, polyvinyl chloride, polybutyral resin, polyurethane resin, cellulose resin, nitrile-butadiene resin series rubber, and styrene-butadiene series rubber, and copolymers thereof, or a thermosetting resins such as epoxy resin, phenol resin, amide series resin, imide-series resin or the like.

In the electronic device as mentioned above, an inductive noise is restrained between a mount portion mounting an active element radiating the inductive noise and a housing body wrapping the mount portion, by the electromagnetic interference suppressing body comprising the support and the composite magnetic material. Therefore, suppression is performed of a radiation noise radiating from the mount portion, a mutual interference between the parts in the circuit on the mount portion (printed circuit board), and an electromagnetic induction between power lines and signal lines, so that electromagnetic obstacle such as erroneous operation can be removed.

Furthermore, in the electronic apparatus, an composite magnetic substance of the electromagnetic interference suppressing body comprises an organic binder and soft magnetic powder being dispersed into the organic binder and having anisotropic magnetic fields different from each other, while the support body of the electromagnetic interference suppressing body is made of an insulator or a conductor. Therefore, a great permeable attenuation can be ensured without increase of a reflection of undesired radiation caused by insertion of conductor. In addition, the electromagnetic interference suppressing body is a thin plate, so that, in comparison with the prior art, miniaturization and light-weight can be realized as a whole of the apparatus including parts in suppression of noise, with a reduced cost. Furthermore, the electromagnetic interference suppressing body is easily given flexibility in view of the structure, to thereby be easily deformable into a complex shape and to be usable under a condition of heavy vibration and shock to be extremely excellent in applicability. Moreover, the electromagnetic interference suppressing body comprises the composite magnetic material which has a fire resistance, so that the suppressing body can be used at a portion of electronic device generating heat and stuck thereto. Accordingly, the electronic apparatus including the mobile communication terminals can stably suppress the electromagnetic interference even in use under a heavy environment and condition, and is, therefore, improved in usefulness.

As the present invention has been mentioned in connection with the preferred embodiments, it will be obvious to those of skill in the Art that various modification can be made without the sprit and scope of the present invention.

As mentioned about the Industrial Applicability, the composite magnetic material of the present invention having fire resistance is used for an electromagnetic interference suppressing body and is most useful for reduction of noises in a printed circuit board for electric parts and in electronic parts using a printed circuit board having active elements mounted thereon.

What is claimed is:

1. A composite magnetic material comprising a metallic soft-magnetic powder and organic binder, said composite magnetic material having non-conductivity and a plurality of anisotropic magnetic field, and also magnetic loss term having a plurality of magnetic resonances taken place in frequency regions different from each other, wherein said plurality of anisotropic fields different from each other is given by monotonous magnetic powder, said monotonous magnetic powder having single kind of composition, a monontonous particle size distribution, and a specific surface area of 0.3 m$^2$/g or more, said monotonous particle size distribution having a distribution curve with a maximum value but without maximal and minimal values.

2. A composite magnetic material as claimed in claim 1, wherein said plurality of magnetic resonances in frequency regions different from each other are caused from mixing a plurality of powders having anisotropic magnetic fields (Hk) different in strengths from each other.

3. An electromagnetic interference suppressing body comprising a composite magnetic material claimed in claim 1.

4. An electromagnetic interference suppressing body as claimed in claim 3, wherein the lowest one of said magnetic resonances occurring in a frequency region lower than a lower limit of the electromagnetic interference suppression frequency band caused by said magnetic interference suppressing body.

\* \* \* \* \*